United States Patent [19]

Armstrong et al.

[11] Patent Number: 4,672,210

[45] Date of Patent: Jun. 9, 1987

[54] ION IMPLANTER TARGET CHAMBER

[75] Inventors: Allen E. Armstrong, Lexington; Victor M. Benveniste, Magnolia; Geoffrey Ryding, Manchester, all of Mass.

[73] Assignee: Eaton Corporation, Cleveland, Ohio

[21] Appl. No.: 772,237

[22] Filed: Sep. 3, 1985

[51] Int. Cl.[4] .................................. H01J 37/00
[52] U.S. Cl. ...................................... 250/492.2
[58] Field of Search ............ 250/492.2, 440.1, 443.1, 250/442.1, 398

[56] References Cited

U.S. PATENT DOCUMENTS

| | | |
|---|---|---|
| 3,384,049 | 5/1968 | Capita . |
| 3,659,552 | 5/1972 | Briody . |
| 4,011,449 | 3/1977 | Ko et al. . |
| 4,155,011 | 5/1979 | Mark . |
| 4,234,797 | 11/1980 | Ryding . |
| 4,254,340 | 3/1981 | Complan et al. ............ 250/492.2 |
| 4,258,266 | 3/1981 | Robinson et al. ............ 250/492.2 |
| 4,261,762 | 4/1981 | King ............................. 250/492.2 |
| 4,346,301 | 8/1982 | Robinson et al. . |

OTHER PUBLICATIONS

PR-200 Ion Implantation System; H. M. B. Bird, J. H. Jackson, B. Weissman, N. Williams; J. Vac. Sci Technol. vol. 15, No. 3, May/Jun. 1978.

Development of Ion Implantation Systems; H. M. B. Bird, B. Weissman; The Western Electric Engineer; Fall 1981.

*Primary Examiner*—Bruce C. Anderson
*Attorney, Agent, or Firm*—D. A. Rowe; F. M. Sajovec

[57] ABSTRACT

A target chamber for a mechanically scanned ion implanter in which semiconductor wafers are maintained in contact with a rotating target disk entirely by body forces, thus eliminating the need for clamping members contacting the wafer surface. The axis of the disk is inclined, and the disk is in the form of a shallow dish having an inclined rim with cooled wafer-receiving stations formed on the inner surface of the rim. Centrifugal force is relied on to force the wafers against the cooled disk. Each wafer-receiving station includes fence structures which are engaged by the wafer during loading and when the disk is spinning. The fence structures are resilient so that wafer damage and thus particulate contamination is minimized. In accordance with another aspect of the invention the ion beam is projected against the wafers obliquely to the radius of the disk as to minimize striping effects and overscan.

19 Claims, 12 Drawing Figures

ION IMPLANTER TARGET CHAMBER

The present invention relates to ion implanters, and more particularly to an improved target chamber for an ion implanter.

In ion implanters used for doping semiconductor wafers, the following criteria are considered to be of extreme importance:

(a) The ion dose must be uniformly distributed over the wafer surface;

(b) No part of the wafer should be overshadowed by a clamp or other retention elements;

(c) Clamps and other retention elements should not be positioned such that material is sputtered from them onto a wafer;

(d) The implanter should be capable of exposing a large number of wafers per unit time;

(e) Heat generated in a wafer as a result of implant energy must be removed efficiently to control wafer temperature;

(f) Any particles generated as a result of target chamber operation must be prevented from settling on the wafers;

(g) Ion beam current must be monitored accurately and frequently to insure correct dosage;

(h) The wafers must be protected from physical damage throughout the implantation process;

(i) The ion beam must impact the wafer surface at the desired angle relative to the crystal planes of the wafer at all points on the wafer.

Target chambers used heretofore have not been capable of achieving all of the above criteria simultaneously. For example, the requirement for cooling as set forth in (e) above has required the use of clamps to force the wafer against a solid conduction medium, or against seals required to contain a gas cooling medium. Such clamps cover a portion of the wafer area, cause clamp material to be sputtered onto the wafers, generate particles by abrading photoresist from the wafer surface, and can deform the wafer to the extent that the ion beam does not impact the wafer surface at the same angle over the entire wafer surface. Also, the clamps present a risk of wafer breakage because the clamping force may not be applied evenly over the wafer surface.

In accordance with the present invention all of the above criteria can be met. In accordance with one aspect of the invention, a target chamber is provided wherein the clamping force required to be applied to the wafers is provided by a body force, i.e. a force dependent upon the mass of the wafer such as gravity, acceleration and magnetic force; or upon a surface area such as electrostatic or gas pressure forces. More specifically, the target chamber of the present invention includes a rotating disk on which the wafers are received, the disk being in the form of a shallow dish such that centrifugal force created by a relatively high rotational speed presses the wafers against the disk.

The use of a spinning disk in an ion implanter is well known in the art as shown by U.S. Pat. No. 4,234,797 to Ryding, as is the use of centrifugal force as shown in U.S. Pat. No. 4,155,011 to Mark. Neither of these prior art devices are capable of meeting all of the criteria noted above, however. In the structure shown in U.S. Pat. No. 4,234,797 clamps must still be used to retain the wafers when the disk is not spinning. In the structure shown in U.S. Pat. No. 4,155,011, the drum diameter must be quite large in order to obtain a uniform implant angle.

In accordance with the present invention the wafer disk is tilted off the vertical orientation which is in common use in the prior art, so that the wafers can be retained on the disk by gravity during the loading and unloading process. While vacuum is often used as a means for clamping wafers during processing, in the present application it has been found to be desirable to pump out the vacuum chamber before the disk is spun in order to protect the wafers from particulate contamination. While the disk could be oriented horizontally to meet the requirement for retaining the wafers on the disk during loading and unloading, this is undesirable because it would require a vertical beamline, and the beamline is of such length that the implanter would not fit within normal ceiling heights. Also, debris and condensed material would tend to fall from the beamline onto the wafers.

In accordance with the present invention the disk is tilted between 30° and 60° from the horizontal (or vertical), which results in the beamline being tilted accordingly. Essentially, the disk must be tilted enough from the vertical to allow the wafers to be held in position by gravity at all positions on the disk, and it must be tilted enough from the horizontal to allow the beamline to clear a standard ceiling.

Another important consideration in the present invention is wafer cooling. An accepted method of cooling wafers undergoing ion implantation is by conduction into an elastomeric backing. The degree of cooling is thus partly dependent upon the contact pressure between the elastomer and the wafer, and the contact pressure obtainable with centrifugal force at acceptable disk speeds is at the low end of the useful range. Accordingly, for relatively high beam powers, a liquid cooled backing is considered to be necessary.

In accordance with the present invention the chamber is purged by a continuous flow of dry gas during loading, the gas exiting the chamber through small loading ports. The entire chamber is not opened for loading, only the relatively small ports. Wafer loading is accomplished by rotating the disk to position a wafer in front of the loading port, reaching through the port with a vacuum chuck to extract the wafer, repositioning the empty wafer position in front of a loading port, and depositing a new wafer by means of a second vacuum chuck.

In order to enhance dose uniformity the present invention also provides an ion beam which is tilted about its own axis. In an ion implanter which employs mechanical scanning, such as that illustrated in U.S. Pat. No. 4,234,797, to Ryding, the shape of the beam at the target is determined by the shape of the ion source extraction aperture, which is typically an elongated rectangle. The resulting slit-shaped beam can be oriented tangentially to the disk, as shown in U.S. Pat. No. 4,346,301 to Robinson et al; however, when the beam current is reduced, the beam size decreases and can become a very fine line. This can result in a "striping" effect, and non-uniform implants. In order to avoid such effects the beam can be oriented radially of the disk, which provides good uniformity, and better thermal characteristics; however, such configuration increases overscan and thus makes less efficient use of the beam.

It can be appreciated from the above that in the prior art the choice of beam orientation has been a compromise between efficient beam use and scan uniformity.

The present invention provides a simple, but very effective solution to the above problems by providing means to tilt the beam somewhat off a purely tangential orientation relative to the disk. The result of such orientation is a projected beam image which has significant width even at low beam currents, and thus avoids "striping effects," while still minimizing overscan.

Other objects and advantages of the invention will be apparent from the following description when taken in conjunction with the accompanying drawings, wherein.

Figure 1:
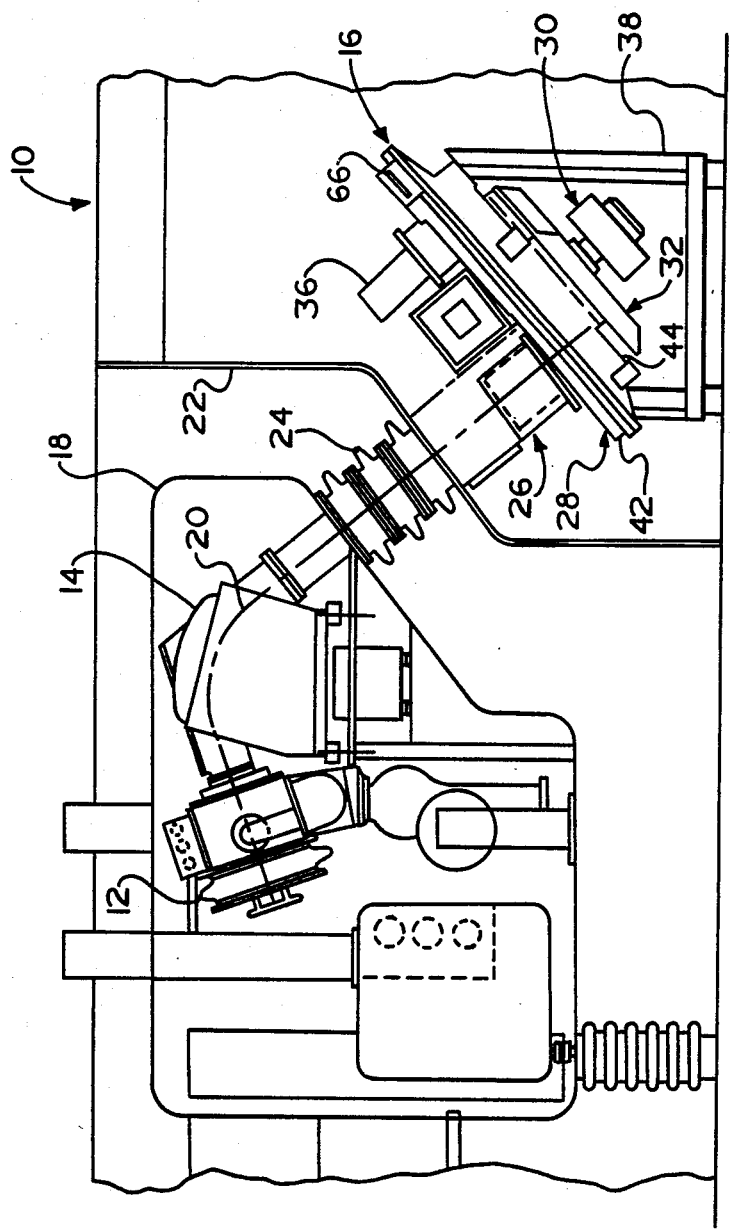
FIG. 1 is a schematic elevation view, with parts cut away, of an ion implanter constructed in accordance with the present invention.

Referring to the drawings, there is illustrated an ion implanter designated generally by the numeral 10, which comprises an ion source 12, an analyzing magnet 14, and a target chamber 16. The source and analyzing magnet are enclosed in a first cabinet 18, which also encloses the power and control components necessary to form a beam 20 of ions of a desired species, and to accelerate and focus the beam. Such elements are well known in the art and are not considered to be part of the present invention.

The target chamber of the present invention is enclosed within a second cabinet 22, which is connected to the first cabinet by means of a conduit 24 which surrounds the beam line 20.

Figure 2:
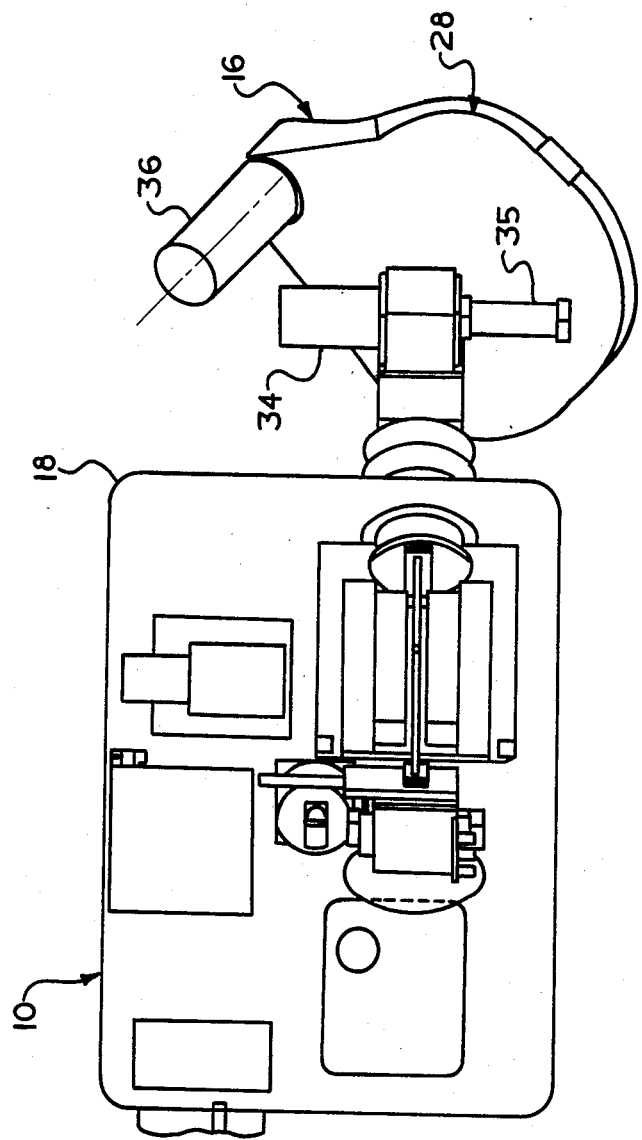
FIG. 2 is a schematic plan view, with parts cut away, of the ion implanter shown in FIG. 1.
Figure 3:
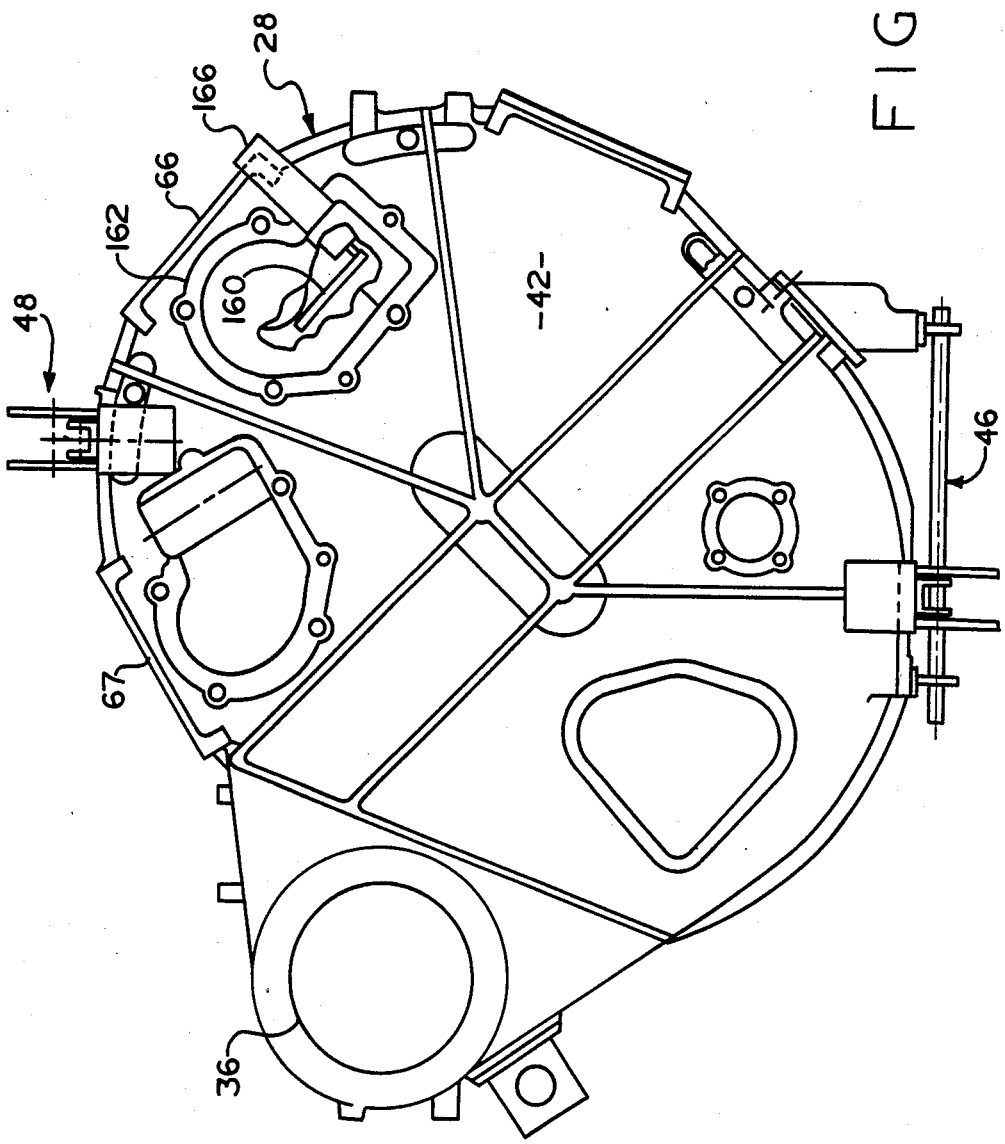
FIG. 3 is a plan view of the target chamber.

As illustrated by FIGS. 1, 2, and 3, the ion implanter 10 is configured such that the beam line is at a substantially 45° angle when it enters the target chamber. As will be described in further detail below, this makes it possible to take advantage of gravitational forces when loading wafers into and unloading them from the target chamber. The target chamber 16 comprises an inlet vacuum chamber 26, a main vacuum chamber 28 communicating with the inlet chamber, a disk indexing and drive system 30, a disk scan system 32, a first cryogenic pump 34 for evacuating the inlet vacuum chamber, a first valve 35 controlling flow into and out of the inlet chamber and a second cryogenic pump 36 for evacuating the main vacuum chamber. The target chamber 16 is mounted on a movable rack 38 which facilitates removal and replacement of the wafer disk assembly of the implanter to change over from one wafer size to another, or to perform maintenance procedures on the target chamber.

Figure 4:
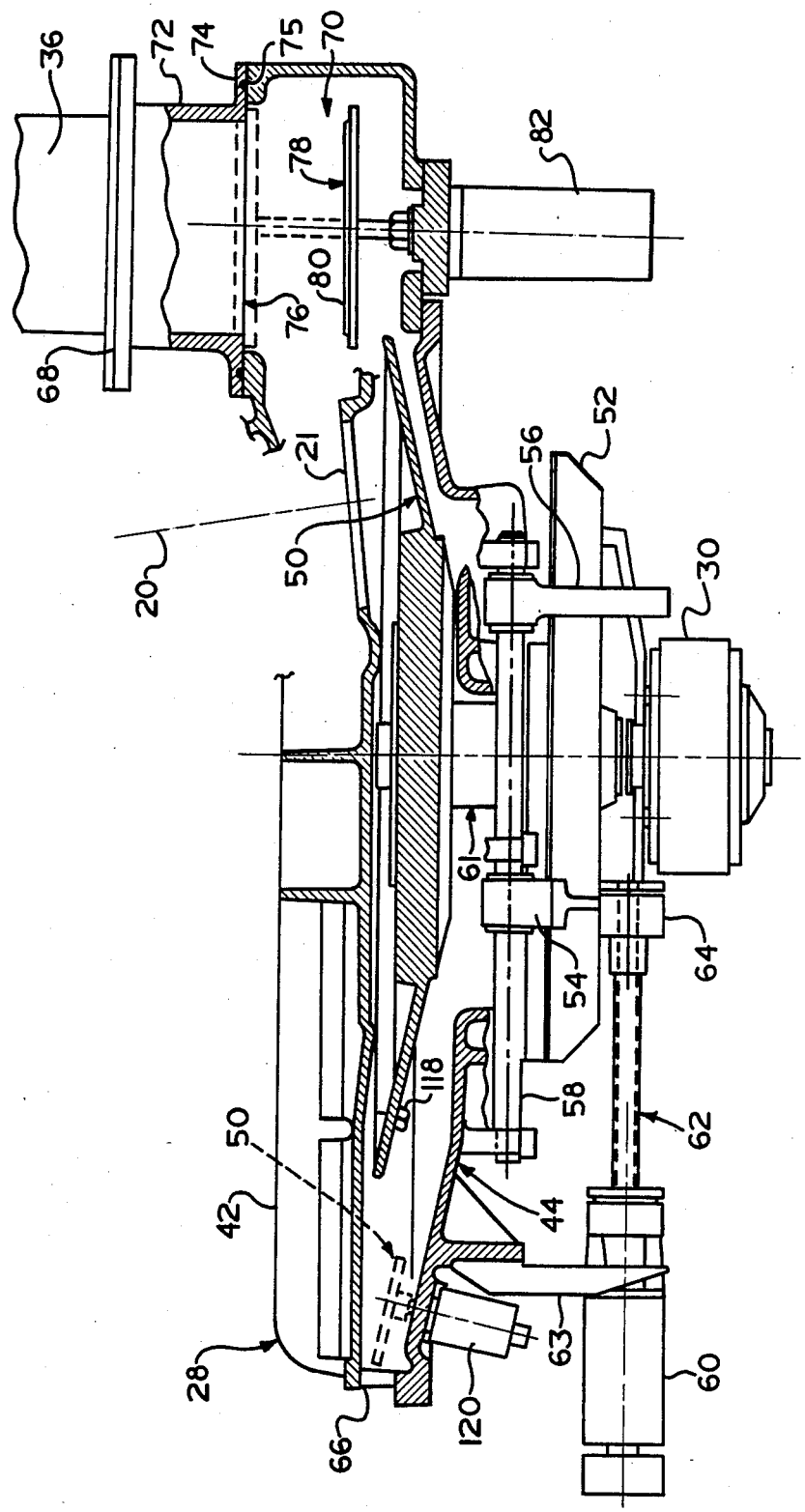
FIG. 4 is a partial sectional view of the target chamber.
Figure 5:
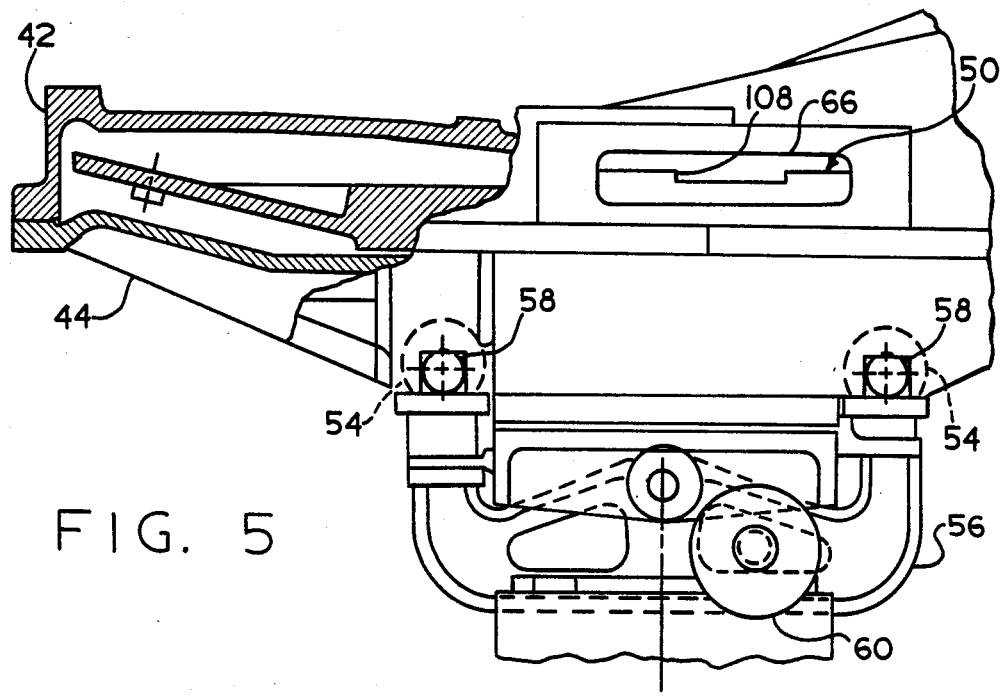
FIG. 5 is another partial sectional view of the target chamber generally rotated 90° from the FIG. 4 view.
Figure 11:
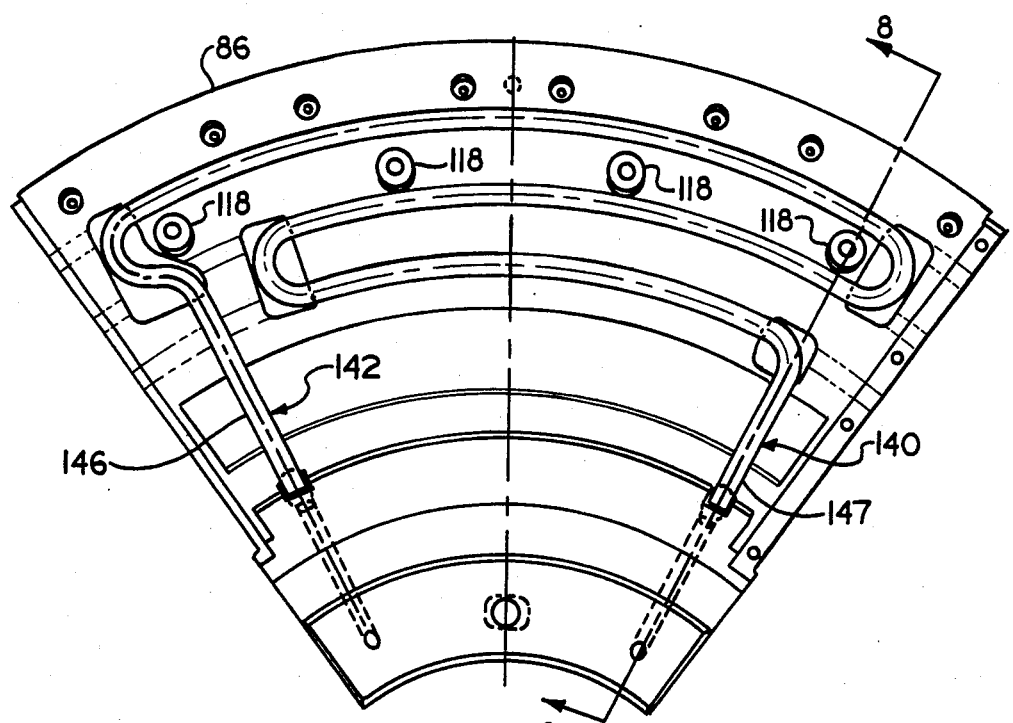
FIG. 11 is a plan view of the underside of one of the disk segments shown in FIG. 6.

Referring particularly to FIGS. 3, 4 and 5, the main vacuum chamber 28 comprises a base member 42, and a cover 44 which is suspended from the base member. The cover is attached to the base by means of a pivot assembly 46, and is secured by a latch mechanism 48.

The wafer disk assembly, designated generally by the numeral 50 is mounted for rotation on the cover 44 and is driven by means of the externally mounted index and drive motor 30. The disk assembly 50 and drive motor 30 are mounted on a vacuum face seal plate 52 which is movable radially with respect to the cover 44 to provide radial scanning movement of the disk. The configuration of the face seal plate and its relation to the cover is essentially the same as that shown in U.S. Pat. No. 4,229,655, which is assigned to the assignee herein, and is incorporated herein by reference.

The face seal plate 52 is supported by linear bearing assemblies 54 and 56 which are movable along shafts 58 fixed to the cover assembly. The drive shaft for the disk extends through a Ferrofluidic (trademark of Ferrofluidics Corp.) seal and bearing assembly 61, and received through a slot (not shown) in the cover, and is moved in a radial direction by means of a scan motor 60, attached to the cover by means of a bracket 63, which drives a leadscrew assembly 62 including a drive nut 64 fixed to the seal plate.

The disk assembly moves radially between the solid line position of FIG. 4 and the broken line position in a controlled manner which insures that the wafers being implanted will receive a uniform dosage. The control system employed herein is essentially the same as that disclosed in U.S. Pat. No. 4,234,797 to Geoffrey Ryding which is assigned to the assignee herein, and which is incorporated herein by reference. When the disk assembly is in the broken line position it is aligned with a loading port 66 and an unloading port 67 (see FIG. 3) as will be described below.

The second cryogenic pump 36 has an inlet 68, as shown in FIG. 4, which is connected to a valve assembly 70 mounted on the vacuum chamber base member 42. The valve assembly comprises a fitting 72 having a flange 74 which is bolted or otherwise fastened to the vacuum chamber and sealed by an O-Ring 75. The flange extends inwardly of the outlet opening in the base member to define a valve seat 76. A valve plate assembly 78 is positioned opposite the fitting 72 and is attached to the cover 44. The valve plate assembly comprises a circular valve plate 80 engageable with the valve seat, and a linear actuator 82, which is operable to move the valve plate between a first, open position shown in solid line in FIG. 4, and a second, closed position in engagement with the seat 76, as shown in broken line.

Figure 6:
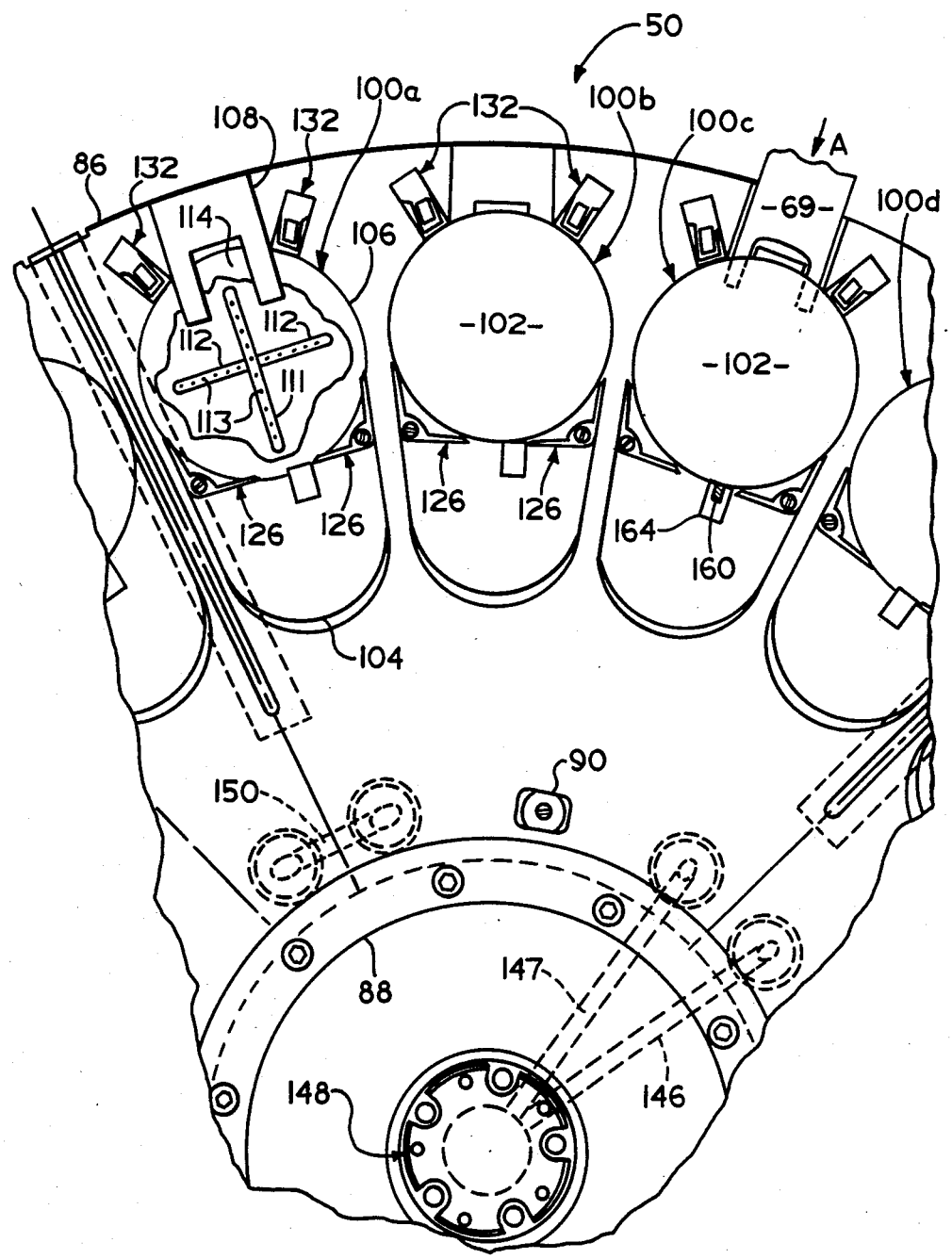
FIG. 6 is a partial plan view of the wafer disk of the invention.
Figure 7:
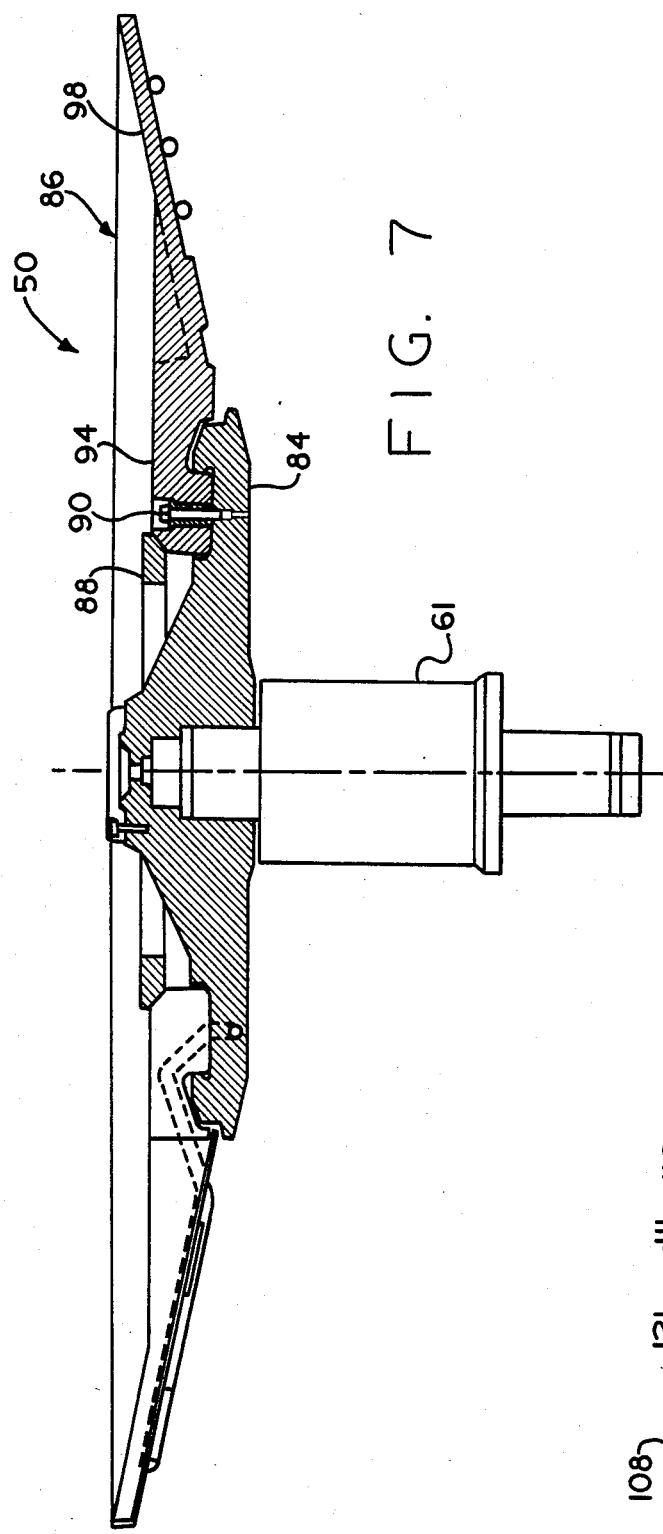
FIG. 7 is a sectional view of the wafer disk assembly.

Referring particularly to FIGS. 6 and 7, the wafer disk assembly 50 comprises a hub 84 and a plurality of disk segments 86 which are received in an annular channel formed in the hub and retained on the hub by means of a locking ring 88, which is bolted to the hub, and also by screws 90. In the embodiment illustrated herein there are five segments 86, each of which is configured to receive four 125 mm diameter wafers. This construction facilitates the replacement of individual segments for maintenance, and also facilitates changing from one wafer size to another. For example, the disk assembly shown can accommodate twenty wafers of 125 mm diameter; however, the disk assembly can be readily changed to take thirty wafers of 82.5 mm diameter, twenty-five wafers of 100 mm diameter, fifteen wafers of 150 mm diameter, or ten wafers of 200 mm diameter.

It can be appreciated that other arrangements are also possible.

As shown in FIG. 7, the hub 84 is fixed to the seal and bearing assembly 61 which insures that the integrity of the vacuum within the chamber 28 will be maintained. The seal and bearing assembly is a commercially available item and will not be described herein in detail.

Each of the segments 86 is essentially identical, and comprises a first inner portion 94 which is perpendicular to the axis of rotation of the hub and a second, outer rim portion 98 which is at an angle to the first portion. When the segments are assembled on the hub, they define a shallow dish having an angled rim on which the wafers are received. In the illustrative embodiment the ion beam intersects the disk axis at an angle of 6°; therefore the rim angle is 13° to the disk axis to produce the customary implant angle of 7° as described in U.S. Pat. No. 4,234,797. As illustrated herein, each of the segments has four wafer stations 100a-100d defined thereon to receive wafers 102 (shown at stations 100b and 100c only) to be implanted.

Figure 8:
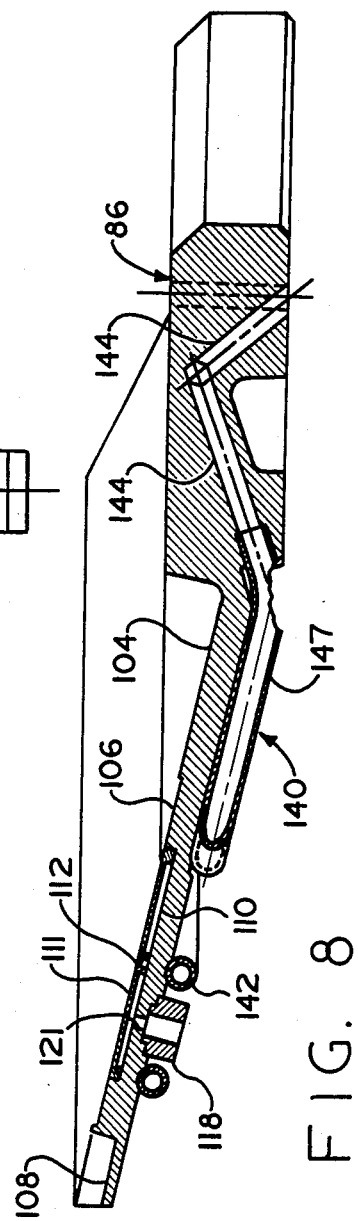
FIG. 8 is a sectional view taken along line 8—8 of FIG. 11.

Referring particularly to FIGS. 6 and 8, each of the wafer stations 100 is defined by a first depression 104 having a bottom surface which is essentially an extension of the angled outer portion 98 of the disk segment, a shallow circular depression 106 in which the wafer is received, and a generally U-shaped depression 108 formed centrally in the outer edge of the segment to provide clearance for a vacuum chuck 69 used to insert wafers and remove them from the vacuum chamber. A cross-shaped channel 110 is formed in the center of the depression 106 and serves as a pressure and vacuum distribution channel as will be described in further detail below.

Since the disk 50 is oriented at an angle to the horizontal, when a wafer is inserted into the loading port 66, it slides by gravity in the direction of the arrow A in FIG. 6 and into a wafer station 100. In accordance with the invention, means are provided to catch and retain the wafers while the disk is indexed for loading and unloading, and to restrain the wafers against centrifugal force when the disk is spinning.

Figures 9, 10:
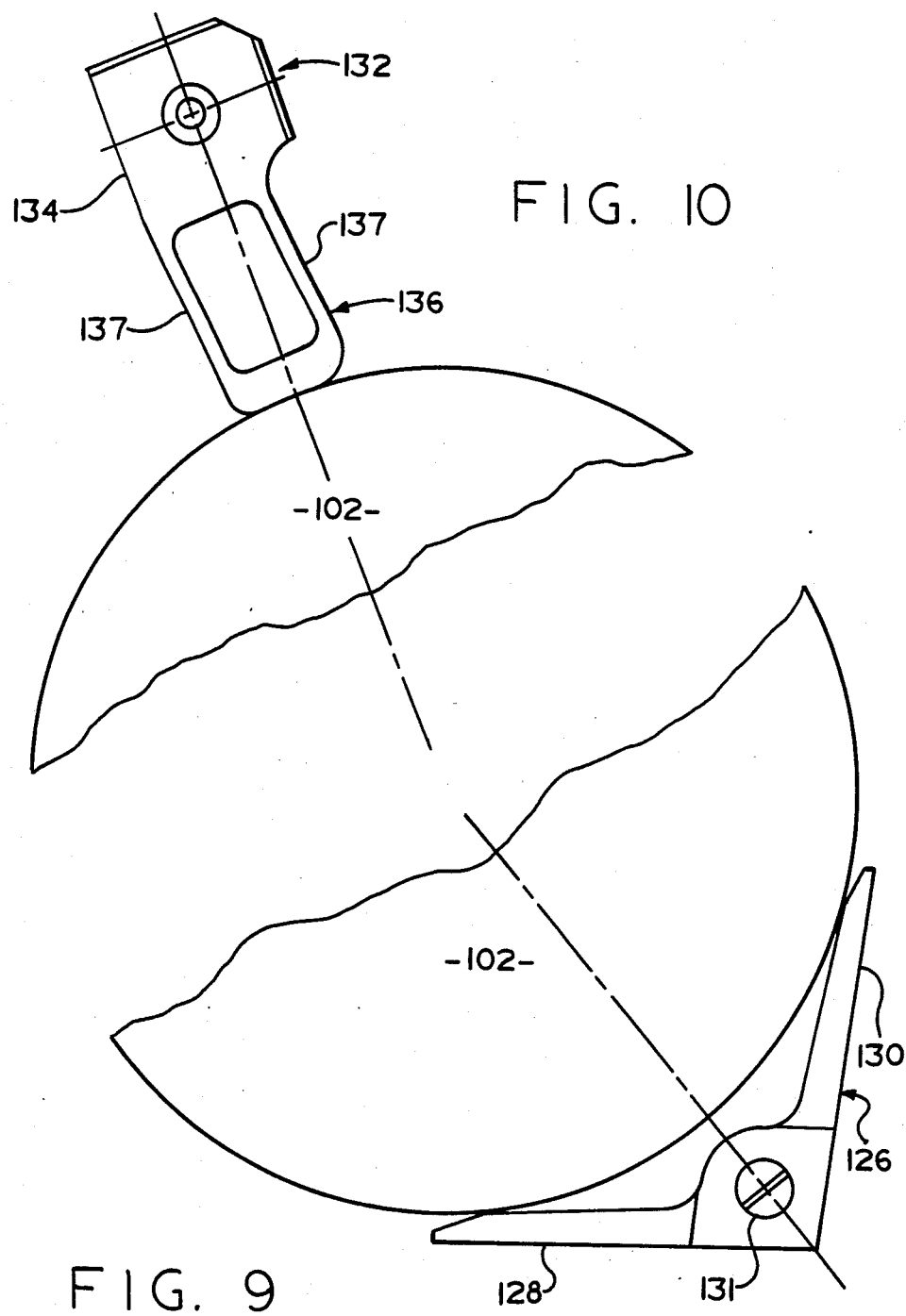
FIG. 9 is an enlarged plan view of a first fence structure of the invention.
FIG. 10 is an enlarged plan view of a second fence structure of the invention.

Referring to FIGS. 6, 9, and 10, each station includes a pair of first fence elements 126 which are operable to deflect slightly when the wafer slides into contact with them. It can be appreciated that semiconductor wafers are very fragile, and that it is extremely important to minimize breakage of the wafer, and also to minimize relative movement between the wafer surfaces and components of the implanter. At the same time the wafers must be accurately positioned on the disk. In the embodiment illustrated herein, each fence 126 is in the form of an L-shaped metallic member having first and second tapered legs 128 and 130, and is attached to the disk by means of a screw 131 at the intersection of the legs. As the wafer slides down the disk it contacts the legs 128 and 130, which deflect slightly to absorb the energy of the sliding wafer, without causing excessive wafer contact force. When the legs return to their undeflected position the wafer is retained in position for implantation, as shown in FIG. 6.

When a wafer is initially inserted into the vacuum chamber, it is deposited over a second set of fence elements 132 disposed adjacent the outside of station 100. Referring particularly to FIG. 10, each second fence element is in the form of a substantially rectangular insert which is received in a depression formed in the surface of the rim 98. The insert includes a base portion 134 pinned to the disk, and a spring portion 136 which is in the form of a cantilevered extension of the base portion with a rectangular hole formed therein to define parallel spring leaves 137 offset slightly from radii of the wafer-receiving depression 106. When the disk rotates, the fence elements 132 resiliently restrain the wafers 100 against the centrifugal force acting thereon. It can be appreciated that the spring portion 136 deflects only slightly under the influence of the centrifugal force.

Referring particularly to FIGS. 6 and 8, when a wafer 102 is initially inserted into the vacuum chamber, it is important that it be accurately positioned at station 100. Accordingly, when the wafer comes to rest against the fences 126, means are provided to move the wafer into engagement with the fences 132 and to retain them in that position during loading and unloading operations, when there is no centrifugal force acting on the wafers.

To initially move the wafer into position, an actuator arm 160, shown in section on FIG. 6 extends from a housing 162 mounted on the chamber base 42 adjacent the load port 66 into a depression 164 formed in the disk surface, and is operable to move the wafer radially outward on the disk surface. The actuator arm is moved by a cylindrical actuator 166 mounted on the housing 162 (see FIG. 3) which is operable to impart rotary motion to the arm about the axis of the actuator to engage the edge of a wafer, as well as linear movement along the axis to slide the wafer into engagement with the fences 132. The actuator can be electrical, mechanical or a combination thereof depending on normal design considerations and is not in itself a part of the present invention.

Referring to FIGS. 6 and 8, the cross channel 110 is provided to permit the application of a vacuum behind the wafer to initially hold it in position against the fences. As best shown in FIG. 8, channel-shaped inserts 111 and 112 are received in the depression 110 and serve as manifolds to distribute vacuum or pressure to the underside of the wafer through a plurality of small apertures 113 formed thorough the inserts.

To enhance cooling of the wafers during processing, the depressions 106 are coated with a layer 114 of an RTV material, with holes formed therethrough corresponding with the apertures 113. Referring to FIGS. 4 and 8, when the disk assembly 50 is translated to the broken line position of FIG. 4 for wafer loading the disk is moved into a position wherein a fitting 118 welded or otherwise fastened to the underside of the disk at each station 100, becomes aligned with and engages a valve unit 120 which is operable to selectively apply vacuum or pressure to the fitting. During the loading process, vacuum is applied to the fitting wehrein a vacuum is drawn on the underside of a wafer positioned at station 100 through the fitting 118, a port 121 formed through the disk, and the inserts 111, 112. Once this area is evacuated the wafer will remain firmly engaged with the RTV, such that the vacuum source can be shut off and the disk indexed to move the fitting 118 out of engagement with the valve unit 120, whereupon the fitting at the next station 100 will be moved into position for vacuum application.

When the implantation process is completed, the fitting 118 can again be engaged by a valve unit 120 and pressure applied to the area beneath the wafer to release the wafer from the RTV layer for unloading.

Referring particularly to FIGS. 6, 7, 8 and 11, each of the segments 86 includes a liquid cooling system designated generally by the numeral 140, which comprises a coolant tube received in a groove formed in the underside of the segment and defining a serpentine pattern in the area of the segment underlying the wafer stations 100, and internal passages 144 formed in the segment. As shown in FIGS. 6 and 8, the cooling system includes a coolant tube 142 having an inlet end 146 and an outlet end 147 connected through a rotary manifold 148 to a source of coolant (not shown), and connecting tubes 150 which interconnect the segments.

Figure 12:
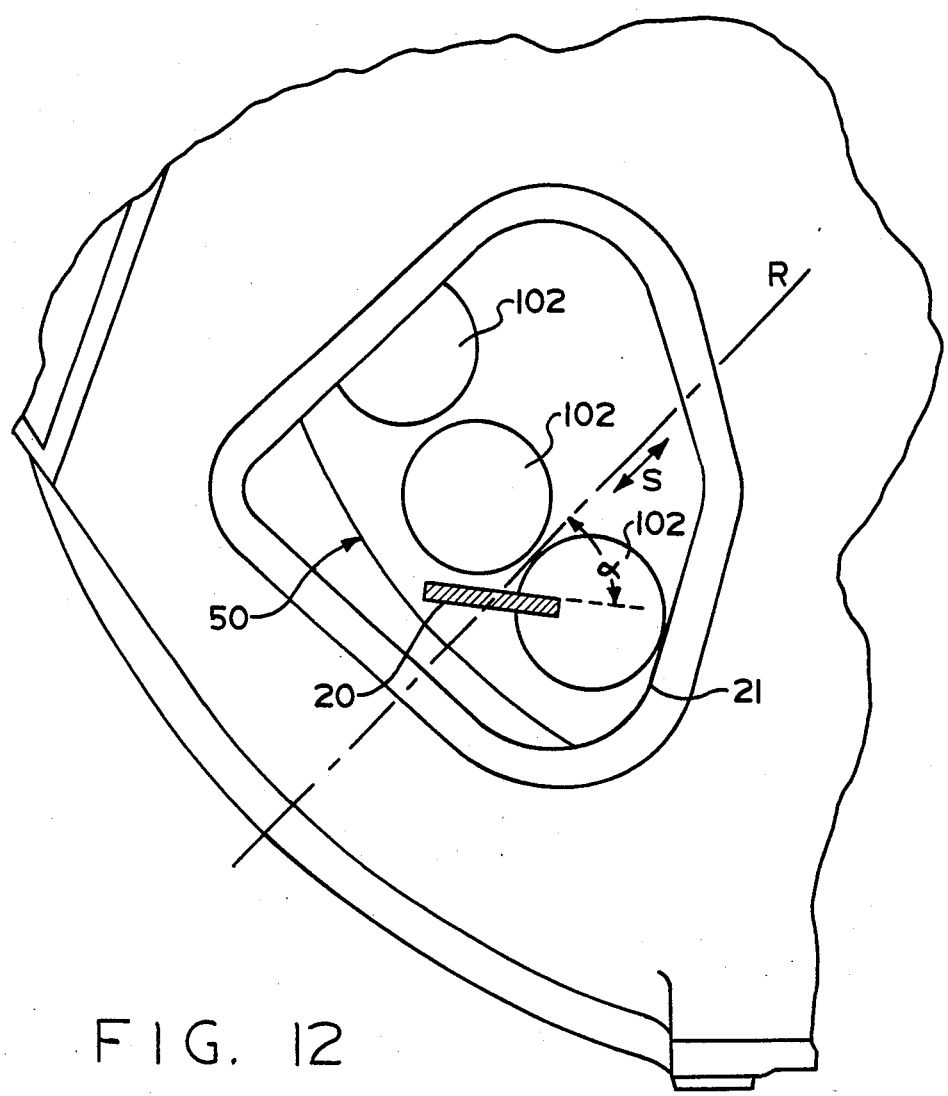
FIG. 12 is an enlarged, schematic view of a portion of FIG. 3, with parts removed for clarity.

In accordance with another aspect of the invention, means are provided to further insure a uniform distribution of the ion dose over the wafer surface. In accordance with the invention, this is accomplished by tilting the ion beam such that the longitudinal axis of the beam is not oriented along a radius of the disk 50, as is generally the case in prior art ion implanters which use mechanical scanning. The geometry of the beam itself, and the apparatus required to produce a beam 20 in the target area of the implanter as illustrated in FIG. 12, are well know in the art, as shown in U.S. Pat. Nos. 4,346,301 to Robinson et al. and 4,011,449 to Ko et al.

Referring particularly to FIGS. 1, 2 and 12 the desired beam orientation is provided by orienting the source 12 and the associated extraction apertures (not shown), such that the beam line 20 as it enters beam port 21 is in the form illustrated in FIG. 12, that is tilted an angle $\alpha$ from a line parallel to a radius R of the disk. The actual value of the angle $\alpha$ is not considered to be critical, and good results have been obtained with an angle of 45° as shown.

The tilted beam 20 as shown herein thus avoids the "striping" effect which could be produced by a beam tangential to the disk, and also avoids the inefficiency of the considerable overscan produced by an elongated beam which is oriented radially of the disk. As illustrated in FIG. 12 the disk 50 is scanned along the radius R in the direction of the arrows S. With the beam 20 oriented as shown the projected beam area which will be produced by the radial scanning, produces minimal overscanning, while avoiding the striping effect of a tangential beam.

OPERATION

An implantation cycle is commenced by closing valve 78 to preserve the vacuum in the remainder of the system, and opening the load port 66. The disk assembly 50 is then translated to the broken line position of FIG. 6 by energizing the scan motor 60. With the disk in position adjacent the load port, the index and drive motor 30 is energized in its indexing mode to place each wafer station at the load port in stepwise fashion for wafer loading. Wafers 102 are then inserted into the chamber 28 preferably by means of a wafer chuck 69 associated with an automated wafer handing system.

When the wafer 102 is inserted into a station 100 and is released by the chuck it slides by gravity in the direction of the arrow A in FIG. 6 and into engagement with the fences 126. The actuator arm 160 is then moved to position the wafer against the fences 132 while a vacuum is momentarily applied to the area beneath the wafer by means of the valve unit 120 to firmly engage the wafer with the RTV film on the wafer station. The disk assembly can then be indexed to succeeding positions until all stations 100 have received wafers.

When loading is completed, the load port is closed, the valve 78 is opened and the cryogenic pump 36 is energized to evacuate the chamber 28. When the normal operating vacuum is obtained, the ion source 12, can be activated along with the other elements which contribute to the formation of the ion beam 20, with the beam 20 entering the port 21 in the orientation illustrated in FIG. 12. At the same time, the index and drive motor 30 is energized in its drive mode to rotate the disk assembly 50 at a relatively high rate (e.g. 1100 rpm–1500 rpm), and the scan system 32 is energized to scan the disk assembly between the solid and broken line positions of FIG. 4. During the implantation process the wafers 102 are maintained in position against the fences 132 and in engagement with the cooled disk assembly (through the interposed RTV layer 114) primarily by components of centrifugal force. It can be appreciated that at no time in the above process is the active surface of the wafer engaged by clamp elements.

When implantation is completed, the disk is stopped at its outermost scan position to put the wafers in position adjacent the unloading port. As each station is indexed to the unloading port, the valve unit 120 at that port is energized to apply pressure to the area beneath the wafer to insure that the wafer is disengaged from the RTV film. The wafer can then be engaged by a vacuum chuck inserted into the depression 108 and removed from the chamber. In an actual operating cycle, wafers can be loaded and unloaded simultaneously by automatic handling means.

We claim:

1. In apparatus for treating a semiconductor wafer comprising a housing; a carrier mounted for rotation within said housing; a plurality of wafer stations formed on said carrier, each of said stations including a substantially flat wafer-receiving surface thereon; drive means for rotating said carrier; and at least one port formed in said housing in position for the passage therethrough of wafers being loaded to or unloaded from said wafer stations; the improvement wherein said carrier is disposed at an angle to the vertical such that wafers loaded to or unloaded from said stations slide by gravity along said wafer-receiving surface; said drive means is operable to index each of said stations to a position adjacent said port; each of said stations includes first stop means engageable by the peripheral edge surface only of a wafer deposited on said wafer-receiving surface when said carrier is stationary, and second stop means engageable by the peripheral edge surface only of said wafer at a point or points essentially diametrically opposed from the point or points of engagement with said first stop means when said carrier is rotating, both said first and second stop means being configured such that no portion of the free flat surface of a wafer on said wafer receiving surface is covered by any portion of said stop means when said carrier is rotating.

2. Apparatus as claimed in claim 1, in which said first stop means is resilient, being capable of deflecting when contacted by a wafer sliding along said wafer-receiving surface.

3. Apparatus as claimed in claim 1, in which said carrier comprises a disk in the form of a shallow dish having a rim portion inclined at an angle to the axis of rotation of the disk, said wafer stations being formed on the inner surface of said rim portion.

4. Apparatus as claimed in claim 3, in which each of said wafer stations comprises a circular depressed area formed in the surface of said rim portion, and said first stop means comprises a first pair of resilient members equally spaced about a radius of said disk intersecting said depressed area in position to engage the edge of a wafer as it slides along said wafer-receiving surface.

5. Apparatus as claimed in claim 4, in which said second stop means comprises a second pair of resilient members equally spaced about a radius of said disk intersecting said depressed area.

6. Apparatus as claimed in claim 4, in which each of said first pair of stop means comprises a substantially L-shaped member, each leg of said L-shaped member having a wafer-engaging surface adjacent the end thereof, said legs being capable of deflecting when a force is applied thereto by a wafer.

7. Apparatus as claimed in claim 6 in which each of said legs defines a tapered cantilever spring member, being wider adjacent the intersection of the legs.

8. Apparatus as claimed in claim 5, in which each of said second pair of stop means comprises a spring member engageable with the edge of a wafer, said spring member being defined by a pair of spaced apart, parallel spring leaves connected by a connecting element engageable with the edge of a wafer, said leaves being disposed at angles to radii of said wafer.

9. Apparatus as claimed in any one of claims 4, 5, 6, 7, 8 or 9 in combination with means for defining an ion beam directed against the surface of said disk, whereby the beam impinges against wafers at said stations, the image defined by said beam being in the form of a rectangle; and means for moving said disk relative to said beam in a direction perpendicular to the beam; including means for orienting said rectangular beam at an oblique angle to the radius of said disk.

10. In an ion implanter comprising means for generating a focused ion beam; an evacuated target chamber disposed in position to intercept said beam; a target disk mounted for rotation within said target chamber; one or more semiconductor wafer stations formed on a surface of said target disk; and means for directing said ion beam against said target disk; the improvement in which said target disk has a plurality of semiconductor wafer stations formed thereon, each of said stations being defined by a flat wafer-receiving surface formed on a surface of said disk in position to intercept said focused beam; and each of said stations includes first stop means engageable by an edge only of a wafer received on said wafer-receiving surface, and second stop means engageable by an edge only of said wafer, said edge being essentially diametrically opposite the edge engaged by said first stop means; said first and second stop means being configured such that no portion of the free flat surface of said wafer is masked from interception of the beam by any portion of said first and second stop means.

11. Apparatus as claimed in claim 10, in which said first stop means is resilient, being capable of deflecting when contacted by a wafer on said waferreceiving surface.

12. Apparatus as claimed in claim 11, in which said target disk is disposed at an angle to the vertical, and each of said stations includes second stop means engageable by an edge only of said wafer, said edge being essentially diametrically opposite the edge engaged by said first stop means, said second stop means being configured such that no portion of the free flat surface of a wafer on said wafer-receiving surface is masked from intercepting the beam by any portion of said second stop means.

13. Apparatus as claimed in any one of claims 10, 11 or 12, in which said target disk comprises a shallow dish having a rim portion inclined at an angle to the axis of rotation thereof, said stations being formed on the inner surface of said rim portion.

14. Apparatus as claimed in any one of claims 10, 11 or 12, in which said first stop means comprises a tapered leaf spring element mounted on said disk adjacent said wafer station.

15. Apparatus as claimed in claim 14, in which said first stop means comprises a plurality of tapered leaf spring elements distributed about a radius of said disk, said plurality of tapered leaf elements being operable to maintain the position of the wafer at the station when said wafer is subjected to body forces.

16. Apparatus as claimed in claim 12, in which said second stop means comprises a spring member including a pair of spaced apart parallel spring leaf elements connected by an integral connecting element engageable with said wafer, each of said leaves being disposed at an angle to radius of said wafer.

17. Apparatus as claimed in claim 16, in which said second stop means comprises a plurality of spring members distributed about a radius of said disk, said plurality of spring members being operable to maintain the position of the wafer at the station when said wafer is subjected to body forces.

18. Apparatus as claimed in claim 10, in which said target disk is defined by a plurality of segments, including means for interconnecting said segments to define a unitary disk structure.

19. Apparatus as claimed in any one of claims 10, 11 or 12, in which said ion beam defines an image in the form of an elongated rectangle, said rectangular image being oriented obliquely to a radius of the disk.

* * * * *